(12) United States Patent
Larson, III

(10) Patent No.: US 6,874,212 B2
(45) Date of Patent: Apr. 5, 2005

(54) METHOD OF MAKING AN ACOUSTIC WAVE RESONATOR

(75) Inventor: John Dwight Larson, III, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 394 days.

(21) Appl. No.: 10/008,838

(22) Filed: Nov. 8, 2001

(65) Prior Publication Data

US 2002/0038989 A1 Apr. 4, 2002

Related U.S. Application Data

(62) Division of application No. 09/652,455, filed on Aug. 31, 2000, now Pat. No. 6,420,820.

(51) Int. Cl.⁷ ..................... H01L 41/083; H04R 17/00
(52) U.S. Cl. ................... 29/25.35; 29/594; 29/831
(58) Field of Search ................. 29/25.35, 594, 29/593, 831, 846; 310/324, 346, 349, 363, 315

(56) References Cited

U.S. PATENT DOCUMENTS

| 3,719,838 A | * | 3/1973 | Peduto et al. | 310/315 |
| 4,056,654 A | * | 11/1977 | Kompanek | 29/25.35 X |
| 4,456,850 A | * | 6/1984 | Inoue et al. | 310/324 |
| 6,060,818 A |   | 5/2000 | Ruby et al. | |

FOREIGN PATENT DOCUMENTS

| JP | 6-164013 | * | 6/1994 | 29/25.35 |

OTHER PUBLICATIONS

Krishnaswamy et al., "Film Bulk Acoustic Wave Resonator Technology", Ultrasonics Symposium, 1990, IEEE Proceedings, De 1990, vol. 1, pp. 529–536.*
Ruby et al., "Micromachined Thin Film Bulk Acoustic Resonators", Frequency Control Symposium, 1994, IEEE 1994 International Proceedings, Jun. 1994, pp. 135–138.*
Endoh, Yasuo et al.,"Zero Sound Anomaly in a Ferroelectric Invar Alloy Fe65Ni35," Journal of the Physical Society of Japa, vol. 46,No. 3,Mar. 1979, pp 806–814.
Lakin, K.M., "Thin Film Resonators and Filters," 1999 IEEE Ultrasonics Symposium, 0–7803–5725–6/99, 1999.
Manosa,Li. et al., "Acoustic–mode vibrational anharmonicity related to the anomalous thermal expansion of Invar iron alloys,"The American Physical Society, vol. 45,No. 5, Feb. 1, 1992, pp 2224–2236.

* cited by examiner

Primary Examiner—A. Dexter Tugbang

(57) ABSTRACT

A method of fabricating an acoustic resonator includes forming a ferromagnetic compensator, such as one comprised of a nickel-iron alloy, which at least partially offsets temperature-induced effects introduced by an electrode-piezoelectric stack. The compensator has a positive temperature coefficient of frequency, while the stack has a negative temperature coefficient of frequency. By properly selecting the thickness of the compensator, temperature-induced effects on resonance may be neutralized. Alternatively, the thickness can be selected to provide a target positive or negative composite temperature coefficient of frequency. In order to prevent undue electromagnetic losses in the ferromagnetic compensator, a metallic flashing layer may be added to at least partially enclose the compensator.

6 Claims, 4 Drawing Sheets

METHOD OF MAKING AN ACOUSTIC WAVE RESONATOR

CROSS REFERENCE TO RELATED APPLICATION(S)

This is a divisional of application Ser. No. 09/652,455 filed on Aug. 31, 2000 now U.S. Pat. No. 6,420,820.

TECHNICAL FIELD

The invention relates generally to acoustic resonators and more particularly to approaches for controlling the resonant frequency of the same.

BACKGROUND ART

Acoustic resonators that are formed of thin films may be used in a number of applications that require a precisely controlled frequency. A Thin Film Bulk Acoustic Resonator (FBAR) or a Stacked Thin Film Bulk Acoustic Resonator (SBAR) may be used as a filter in a cellular telephone or other device in which size, cost and frequency stability are important factors.

An FBAR includes a thin film of piezoelectric material between two conductive electrodes, while an SBAR includes additional layers of piezoelectric material, with each such layer separating two electrodes. While solidly mounted resonators are known, the active layers of an FBAR or SBAR are often suspended in air by supporting the layers around the perimeter. The air/resonator interfaces at both sides of the stack of layers partially trap the energy that is generated during operation.

When a time-varying electrical field is created by applying a signal across two electrodes that are separated by a piezoelectric layer, the piezoelectric material converts some of the electrical energy into mechanical energy in the form of sound waves. The sound waves propagate in the same direction as the electrical field and are reflected at the air/resonator interfaces. For a properly fabricated FBAR or SBAR, the sound waves will have a particular mechanical resonance.

As mentioned above, an FBAR or SBAR can be used as a filter, since it will function as an electronic resonator when allowed to operate at its mechanical resonant frequency. At this mechanical resonant frequency, the half wavelength of the sound waves propagating through the resonator is approximately equal to the total thickness of the resonator for a given phase velocity of sound in the piezoelectric material. Acoustic resonators may be used alone or in combination. For example, a bandpass filter is formed by electrically connecting several resonators to provide a desired filter response. Several filter topologies are possible. One favored topology is the half-ladder topology, where a group of resonators are connected in series (series resonators) and in between the series resonators are shunt resonators that are connected to ground. The series resonators are fabricated such that their resonant frequency is approximately 3% higher than the shunt resonators. Since the thickness of the piezoelectric layer can be the same for the series and shunt resonators, the piezoelectric deposition is often "shared" between resonators.

It becomes manifest that an important characteristic of acoustic resonators is an ability to maintain resonance. This has proved problematic when acoustic resonators are placed in an environment that undergoes temperature fluctuations, since a frequency shift ($\Delta f$) will occur if a variation in temperature ($\Delta T$) induces a change in the thickness ($\Delta t$) and/or wave velocity ($\Delta V$) for one or more layers of a resonator. Specifically, the resonant frequency $f_0$ and the temperature coefficient of frequency are respectively defined as follows:

$$f_0 = V/2t_0 \quad (1)$$

$$\Delta f/f_0 = \Delta V/V - \Delta t/t_0 \quad (2)$$

where V is the velocity of the acoustic wave propagating through the acoustic resonator and $t_0$ is the thickness of the resonator. The thickness is defined in terms of the acoustic wavelength as follows:

$$t_0 = \lambda/2 \quad (3)$$

where $\lambda$ is the wavelength of the acoustic wave in the medium through which it propagates. In the materials employed to fabricate acoustic resonators, the thickness, $t_0$, usually increases with positive changes in temperature, $\Delta T$. On the other hand, the velocity of wave propagation through the materials usually decreases with positive changes in temperature. These two factors combine to provide the phenomenon that is referred to as negative temperature coefficient of frequency. From equations (1) and (2) it is seen that the resonant frequency, $f_0$, of an acoustic resonator generally decreases as the temperature increases. This fluctuation in resonance is often an undesirable characteristic.

One known approach to compensating for the variations in temperature is to incorporate a frequency stabilization circuit. However, space restrictions of cellular phones and similar devices impose limitations on the use of auxiliary circuits. Another approach is described in a paper entitled "Thin Film Resonators and Filters" by K. M. Lakin, 1999 *IEEE Ultrasonics Symposium*, Jun. 1, 1999. This second approach applies to solidly mounted resonators (SMRs), which are mounted along a supporting surface, rather than being suspended by peripheral support from the supporting surface. Acoustic isolation being an SMR and the substrate in which it is formed is achieved by forming a reflector (typically a Bragg reflector) between the SMR and substrate. The reflector is a layer stack having alternating layers of high index and low index materials, with each layer having a thickness of approximately one-quarter wavelength of the resonant frequency of the SMR. According to the second approach, if silicon dioxide ($SiO_2$) is used to form one of the index-specific layers, a degree of temperature compensation will occur as a result of the temperature coefficient of $SiO_2$. However, a drawback is that $SiO_2$ is hydrophilic, so that the performance of the SMR may degrade in a humid atmosphere. Another concern is that the level of compensation is partially determined by the target resonant frequency, since the $SiO_2$ is formed as one-quarter wavelength layers.

What is needed is an acoustic resonator and method of using the same that maintains resonance when subjected to variations in temperature.

SUMMARY OF THE INVENTION

An acoustic resonator includes an electrode-piezoelectric layer stack having a negative temperature coefficient of frequency that is at least partially offset by acoustically coupling a compensator to the electrode-piezoelectric stack. The compensator is formed of a material with properties that cause the compensator to counter temperature-induced effects on resonance, where such effects are introduced by temperature variations to the electrode-piezoelectric stack.

In one embodiment, the compensator is formed of a ferromagnetic material. In the more preferred embodiment, the material is a nickel-iron alloy, with the most preferred embodiment being one in which the alloy consists of approximately 35% nickel and approximately 65% iron. The compensator should exhibit a positive coefficient of frequency. The thickness of the compensator may be selected such that the magnitude of the temperature-induced effects on resonance, as a result of the presence of the compensator, is substantially equal to the magnitude of the temperature-induced effects on resonance of the negative temperature coefficient of frequency of the electrode-piezoelectric stack. As one example, it is believed that a 0 ppm/° C. composite coefficient can be obtained if the nickel-iron alloy compensator has a thickness of 3320 Å, while the stack includes molybdenum electrodes having thicknesses of 1100 Å on opposite sides of an aluminum nitride layer having a thickness of 15,200 Å.

Ferromagnetic materials have the disadvantage of being associated with large electrical losses at microwave frequencies. To prevent this, a flash layer of molybdenum may be used to encase the ferromagnetic alloy and divert the current flow around it. For example, a thin layer (e.g., 200 Å) of molybdenum may be formed on a side of the compensator opposite to the electrode-piezoelectric stack. While other materials may be used, the preferred embodiment is one in which the flashing material is the same as the electrode material.

Still referring to the preferred embodiment, the compensator and the electrode-piezoelectric stack are suspended from the surface of a substrate. Thus, it is not necessary to include a Bragg reflector or other mechanism for allowing the resonating layers to be in contact with a substrate.

One advantage to the invention, relative to prior means of providing compensation for the negative temperature coefficient of frequency typically exhibited by electrode-piezoelectric stacks, is that the compensator of the invention may have a thickness that is independent of the desired wavelength of the target resonant frequency. That is, rather than having a thickness that is selected to be a one-quarter wavelength layer within a Bragg reflector, the thickness of the compensator may be selected to tailor the compensating capabilities of the compensator. Another advantage of the invention is that the compensator is formed of a metal, so that the electrical resistance of the electrodes is not significantly affected. Yet another advantage is that the preferred nickel-iron alloy can be etched using the same wet etch as is conventionally used to pattern the electrodes. Moreover, the compensator is not hydrophilic, so that it does not degrade in a humid environment.

DETAILED DESCRIPTION

Figure 1:
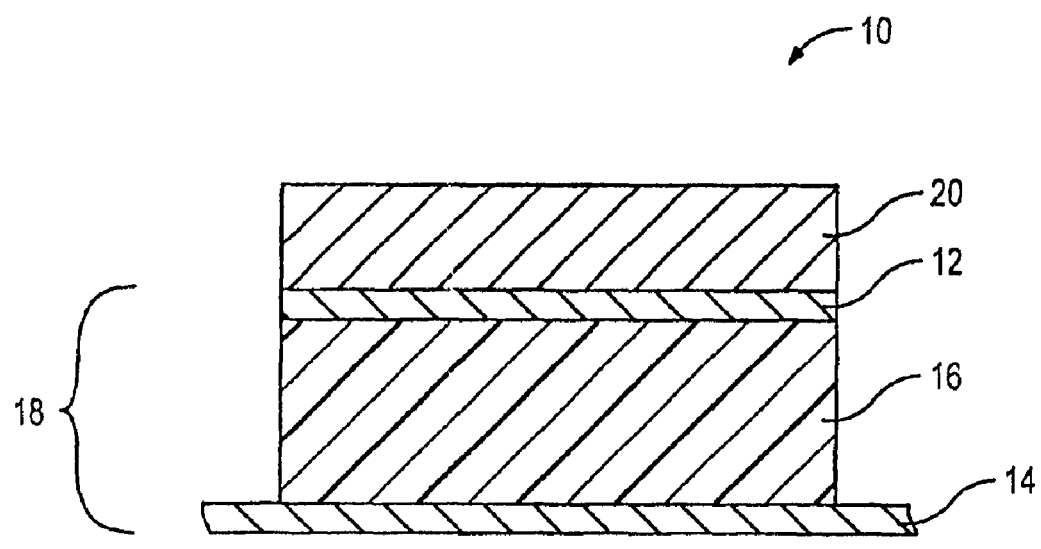
FIG. 1 is a side sectional view of an acoustic resonator in accordance with the present invention.

Referring to FIG. 1, an exemplary embodiment of an acoustic resonator 10 includes a pair of opposed electrodes 12 and 14. Between the opposed electrodes 12 and 14 is a piezoelectric body 16, forming an electrode-piezoelectric stack 18. The stack 18 is typically referred to as a thin film bulk acoustic resonator (FBAR).

Disposed adjacent to the stack 18 is a compensator body 20 that facilitates stabilization of the resonant frequency of the acoustic resonator 10 when subjected to temperature variations. This is achieved by forming the compensator body 20 from one or more materials having a positive temperature coefficient of frequency. The positive temperature coefficient of frequency compensates for the negative temperature coefficient of frequency of the materials from which the electrode-piezoelectric stack 18 is formed.

Typically, the piezoelectric body 18 is formed from any piezoelectric material that provides a reasonably high electromechanical coupling constant and low dielectric constant. Examples of dielectric materials that may be employed are ZnO, AlN and lead zirconate titantate. The electrodes 12 and 14 are constructed from a conductive material, such as aluminum, gold, molybdenum, titanium, tungsten and the like. The characteristics of the materials from which the piezoelectric body 18 and the electrodes 12 and 14 are formed vary in response to changes in temperature. This results in the resonant frequency of the resonator 10 decreasing with increases in the temperature. Specifically, the velocity characteristics of these materials decrease with increasing temperatures, so that there is a decreased velocity of an acoustic wave propagating through the stack. In addition, the thickness of the materials increases with increasing temperature.

It was found that the dominant contribution to temperature changes in resonance is attributable to changes in the velocity characteristics of the materials that form the stack. As a result, the compensator body 20 is selected to have velocity characteristics that change positively with changes in temperature. To that end, the compensator body 20 is formed preferably from a metallic alloy consisting essentially of approximately 35% nickel and 65% iron. The alloy is sold by International Nickel Company under the trademark INVAR. This alloy forms a layer having a thickness that is substantially invariant to changes in temperature. The velocity characteristics, however, vary positively with changes in temperature. In a paper entitled "Zero Sound Anomaly in a Ferromagnetic INVAR Alloy," by Y. Endoh et al. (Journal of the Physical Society of Japan, Vol. 46, No. 3, March 1979, pages 806–814), data was presented which suggests that INVAR has a temperature coefficient of frequency of +170 ppm/° C. As a comparison, a temperature coefficient of frequency for INVAR is suggested to be approximately +239 ppm/° C. in data presented by L I. Mañosa et al. in a paper entitled "Acoustic-mode Vibrational Anharmonicity Related to the Anomalous Thermal Expansion of INVAR Iron Alloys," Physical Review B, The American Physical Society, Volume 45, No. 5, 1 Feb. 1992, pages 2224–2236. By properly selecting the thick ness of the compensator body 20, a resonator 10 may be formed having a composite temperature coefficient of frequency that is substantially zero. Alternatively, the magnitude of the composite temperature coefficient of frequency may be set to a positive or negative value, so that changes in resonance are proportional or negatively proportional to the changes in temperature. In this manner, the resonator 10 may be provided with virtually any thermal coefficient of frequency desired, dependent upon the application.

Figure 2:
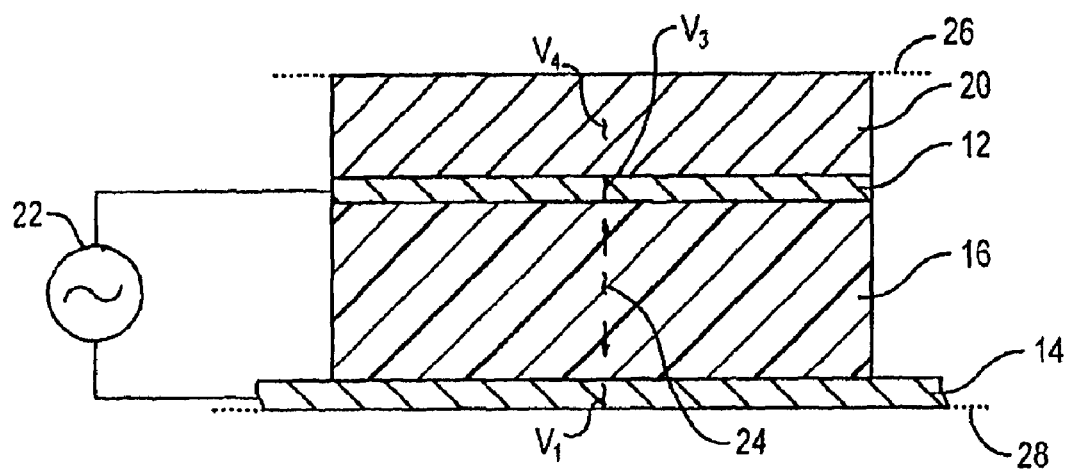
FIG. 2 is a side sectional view of the acoustic resonator, shown in FIG. 1, connected to a voltage source.

Referring to FIG. 2, a voltage source 22 is connected between the electrodes 12 and 14. The electric field produced between the electrodes 12 and 14 by the voltage source 22 generates, within the piezoelectric body 16, an acoustic wave 24. The acoustic wave propagates between the planes 26 and 28. The plane 26 represents the interface of the compensator body 20 and surrounding ambient. The plane 28 represents the interface of the electrode 14 and the surrounding ambient.

As previously noted, each of the layers of an acoustic resonator has a thickness (t) and a wave velocity (V) that vary with temperature. It is also known that the phase ($\phi$) of waves propagating within the acoustic resonator between planes 26 and 28 will vary as a function of the frequency of the acoustic resonator. Specifically, the phase of the waves propagating within the resonator 10 of FIGS. 1 and 2 is:

$$\phi = 2\pi f(t_1/V_1 + t_2/V_2 + t_3/V_3 + t_4/V_4) \quad (4)$$

where $t_1$ and $V_1$ relate to the properties of the bottom electrode 14, $t_2$ and $V_2$ relate to the properties of the piezoelectric body 16, $t_3$ and $V_3$ relate to the properties of the top electrode 12, and $t_4$ and $V_4$ relate to the properties of the compensator body 20. Frequency stability is achieved when $\phi = \pi$ and the sum of the factors within the parentheses of equation (4) is fixed. In the preferred embodiment of the invention, this sum is substantially fixed by allowing the fourth factor (i.e., $t_4/V_4$) to vary inversely with the sum of the other three factors (i.e., $t_1/V_1 + t_2/V_2 + t_3/V_3$).

As the temperature of the resonator 10 increases, the velocity $V_2$ of the acoustic wave 24 in the piezoelectric body 16 decreases and the thickness $t_2$ increases. In addition, the velocity of the acoustic wave as it propagates through the electrodes 12 and 14, shown as $V_1$ and $V_3$, respectively, decreases and the thicknesses $t_1$ and $t_3$ increase. However, the decreased velocities of the acoustic wave are compensated by the presence of the compensator body 20. Specifically, the velocity $V_4$ of the acoustic wave in the compensator body 20 increases with increasing temperature. Were the magnitude of temperature-induced changes in the compensator body equal to the magnitude of such changes in the electrode-piezoelectric stack, there would be no appreciable change in the overall phase $\phi$ of the acoustic waves propagating between planes 26 and 28. Hence, the resonant frequency of the resonator 10 would be maintained in the presence of temperature variations.

Figure 3:
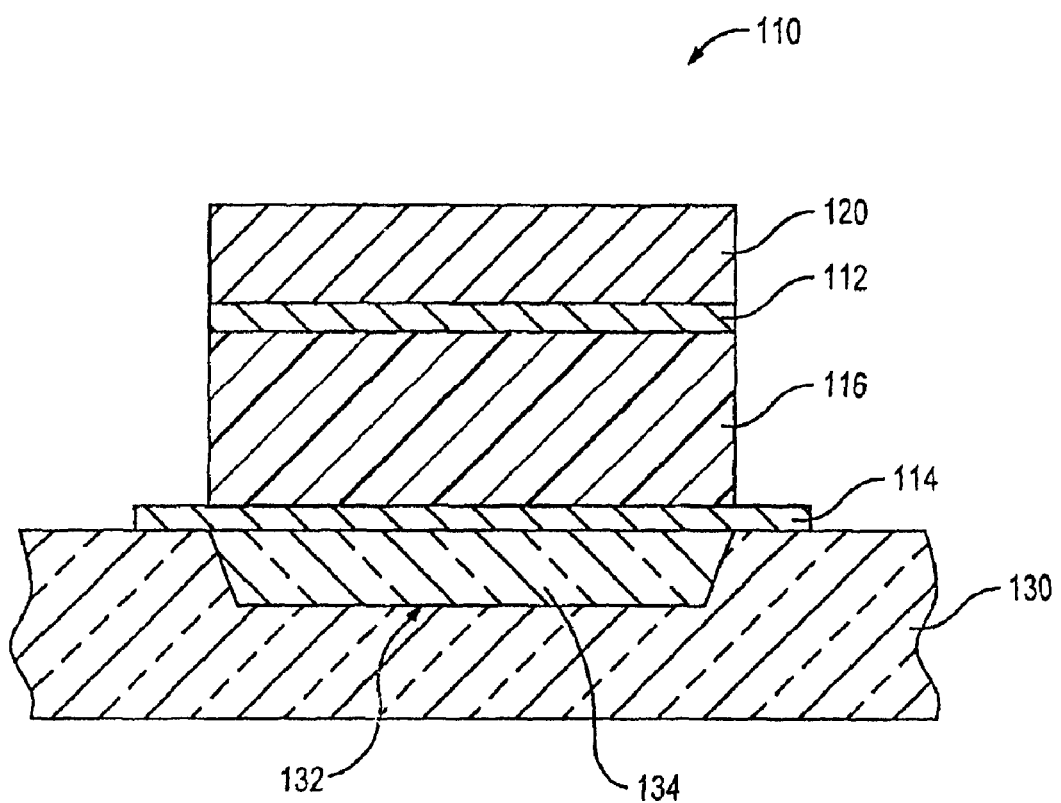
FIG. 3 is a side sectional view of the acoustic resonator, shown in FIG. 1, formed on a wafer in accordance with the present invention.

Referring to FIG. 3, in a specific example, a resonator 110 is fabricated employing conventional semiconductor processes. To that end, the resonator 110 is fabricated on a silicon wafer 130 having one surface etched to form a cavity 132. This is typically achieved employing KOH to remove a few microns of the silicon, referred to as a pre-slotting. The amount of silicon removed by the KOH is chosen to avoid structural compromise of the wafer 130 during subsequent processing. Phospho-silicate glass 134 is deposited in the cavity and is polished flat by known mechanical means. The deposition and subsequent removal of the glass is described in U.S. Pat. No. 6,060,818 to Ruby et al., which is assigned to the assignee of the present invention.

After the glass 134 is formed in the cavity 132, one electrode 114 is deposited on the surface of the wafer 130. In the present example, the electrode 114 is fabricated employing sputter deposition techniques to form a layer of molybdenum approximately 1100 Å in thickness. This results in the electrode 114 having a negative thermal coefficient of frequency of approximately −45 ppm/° C.

The piezoelectric body is formed by depositing a layer of AlN 116 adjacent to the electrode 114 to have a thickness of approximately 15,200 Å. This results in the piezoelectric body 116 having a negative thermal coefficient of frequency of approximately −25 ppm/° C.

The additional electrode 112, which is also formed from molybdenum, is then deposited adjacent to the layer of AlN 116 to have a thickness of approximately 1100 Å. The compensator body 120 is formed adjacent to the electrode 112 employing sputter deposition techniques to have a thickness of approximately 3320 Å. The compensator body has a positive temperature coefficient of frequency of approximately, 170 ppm/° C. During fabrication, the edges of the elements 112, 116 and 120 are photolithographically etched to coincide with each other and with the edges of the cavity 132. Thus, all points of the suspended stack will have the same resonant frequency $f_0$. As a result, "spurious" nearby resonances which would otherwise result from partial mass loading effects are prevented.

After deposition of the electrode 112 and compensator body 120, the phospho-silicate glass 134 is etched from under the resonator structure to complete the formation of the cavity 132. This may be achieved employing a dilute hydrofluoric acid solution. The removal of the remaining glass leaves a substantial portion of the electrode 114 and, therefore, the resonator 110 spaced-apart from the wafer 130.

In this manner, a resonator 110 is formed having a thermal coefficient of frequency of approximately 0 ppm/° C. Thus, for temperature variations in the range of −30° C. to 85° C., the resonator 110 may be fabricated to maintain a constant resonant frequency at approximately 1.9 GHz in this example. Such techniques may be applied to form resonators at frequencies anywhere from 0.4 to 10 GHz.

Figure 4:
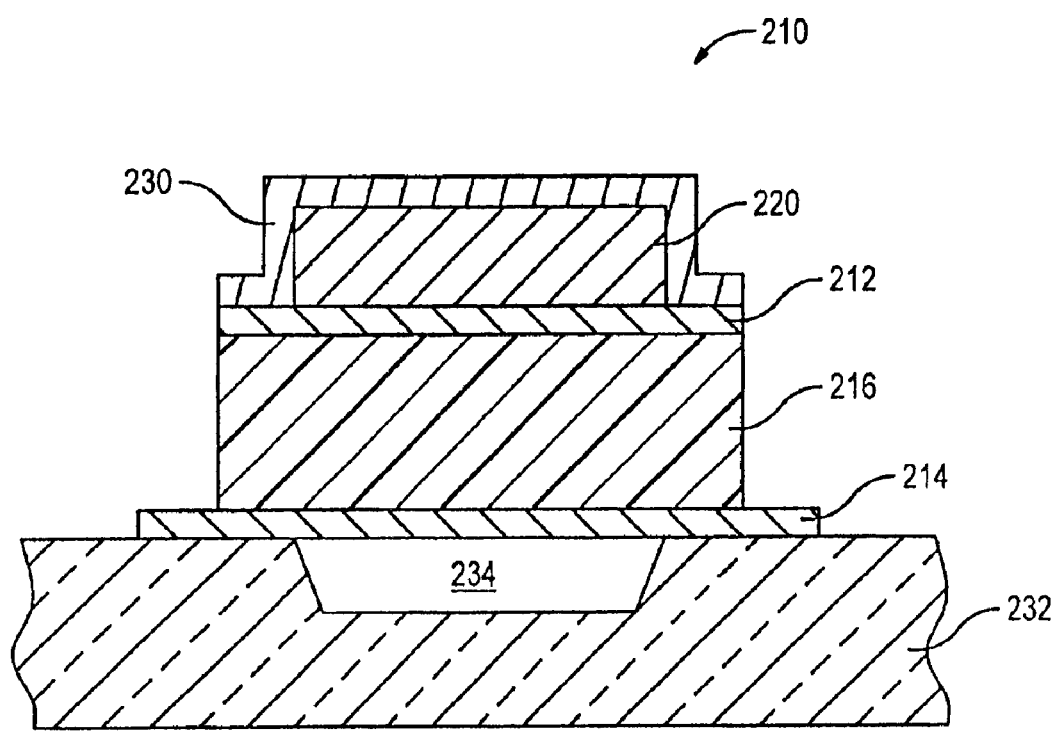
FIG. 4 is a side sectional view of the acoustic resonator, shown in FIG. 3, in accordance with an alternative embodiment of the present invention.

Referring to FIG. 4, another embodiment of a resonator 210 is shown as including a flashing 230 covering the compensator body 220. The preferred materials from which the compensator body 220 is formed are ferromagnetic materials, which may exhibit large electromagnetic losses. The presence of this loss degrades the quality factor of the resonator, and is detrimental. The flashing 230 is included to provide a low loss current path around the compensator body 220. To that end, the flashing 230 covers exposed regions of the compensator body 220, i.e., regions that are not positioned adjacent to the electrode 212. Although the flashing 230 may be formed from any conductive material, the flashing 230 is preferably formed from the same materials as the electrodes 212 and 214. The flashing is lithographically patterned so that the extra mass of layer 230 on the edges of electrode 212 is over the silicon substrate 232, wherein cavity 234 is contained. This will effectively damp any spurious resonances.

The flashing 230 and the electrodes 212 and 214 are formed of Mo and each has a thickness of approximately 1100 Å. The piezoelectric body 216 is formed from AlN having a negative thermal coefficient of frequency of approximately −25 ppm/° C. Therefore, were it desired to have resonator 210 which exhibits a temperature coefficient of frequency of approximately 0 ppm/° C., the compensator body 220 must have a sufficient thickness to provide an offsetting positive temperature coefficient of frequency. With this configuration, the resonator 210 of the silicon substrate 232 would maintain a constant resonant frequency for resonators with frequencies chosen in the range of 200 MHz to 10 GHz, and subjected to temperature variations in the range of −30° C. to 85° C.

Various modifications to the present invention will become apparent to those skilled in the art from the foregoing description and accompanying drawings. For example, the discussion has concerned an FBAR technology. However, the invention is equally applicable to SBAR technology. Moreover, the compensator bodies have been shown as being on the side of the electrode-piezoelectric stack opposite to the substrate, but the compensator body could be formed directly on the substrate or on a flashing that contacts the substrate. Accordingly, the invention should not be limited to the exemplary embodiments discussed above, but should be determined in view of the attached claims, including the full scope of equivalents thereof.

What is claimed is:

1. A method of fabricating an acoustic resonator comprising the steps of:

providing a substrate; and forming an electrode-piezoelectric stack on said substrate such that a portion of said electrode-piezoelectric stack is suspended from contact with said substrate by a cavity having a boundary defined by said electrode-piezoelectric stack, said electrode-piezoelectric stack having a negative temperature coefficient of frequency, and (a) forming a compensator layer, comprised of a ferromagnetic material, in direct contact with said electrode-piezoelectric stack, including selecting a material for said compensator layer having a positive temperature coefficient of frequency.

2. The method of claim 1 wherein said step (a) that includes selecting said material includes selecting a nickel-iron alloy.

3. The method of claim 1 wherein said step (a) includes depositing said material as approximately 35 percent nickel and approximately 65 percent iron.

4. The method of claim 1 wherein said step (a) includes selecting a layer thickness to substantially match a magnitude of temperature-induced effects on resonance by operation of said electrode-piezoelectric stack with a magnitude of temperature-induced effects on said resonance as a consequence of said compensator layer.

5. The method of claim 1 wherein said step of forming said compensator layer further includes (b) forming a metallic flashing layer on a side of said compensator layer opposite to said electrode-piezoelectric stack.

6. The method of claim 5 further comprising using fabrication alignment techniques in said steps (a) and (b) to prevent spurious mode generation resulting from partial coverage of said electrode-piezoelectric stack by said compensator layer.

* * * * *